(12) United States Patent
Galburt et al.

(10) Patent No.: US 7,292,308 B2
(45) Date of Patent: Nov. 6, 2007

(54) SYSTEM AND METHOD FOR PATTERNING A FLEXIBLE SUBSTRATE IN A LITHOGRAPHY TOOL

(75) Inventors: Daniel N. Galburt, Wilton, CT (US); Stanley G. Janik, Naugatuck, CT (US)

(73) Assignee: ASML Holding N.V. (NL)

( * ) Notice: Subject to any disclaimer, the term of this patent is extended or adjusted under 35 U.S.C. 154(b) by 21 days.

(21) Appl. No.: 11/068,165

(22) Filed: Mar. 1, 2005

(65) Prior Publication Data

US 2005/0211919 A1 Sep. 29, 2005

Related U.S. Application Data

(60) Provisional application No. 60/555,302, filed on Mar. 23, 2004.

(51) Int. Cl.
*G03B 27/58* (2006.01)
*G03B 27/42* (2006.01)

(52) U.S. Cl. .......................... 355/47; 355/53
(58) Field of Classification Search ............. 355/50, 355/53, 72–77, 47
See application file for complete search history.

(56) References Cited

U.S. PATENT DOCUMENTS

| | | | | |
|---|---|---|---|---|
| 5,652,645 | A | * | 7/1997 | Jain ........................ 355/53 |
| 5,967,048 | A | * | 10/1999 | Fromson et al. ......... 101/463.1 |
| 6,018,383 | A | * | 1/2000 | Dunn et al. ............... 355/49 |
| 6,819,424 | B1 | | 11/2004 | Honma |
| 2002/0063856 | A1 | * | 5/2002 | Inoue ........................ 355/53 |

FOREIGN PATENT DOCUMENTS

| | | |
|---|---|---|
| JP | 63-1545 A | 1/1988 |
| JP | 2-100036 A | 12/1990 |
| JP | 4-65443 U | 6/1992 |
| JP | 2000-122261 A | 4/2000 |
| JP | 2000-214595 | 8/2000 |
| JP | 2000-235267 A | 8/2000 |

OTHER PUBLICATIONS

Office Action for Japanese Patent Application No. 2005-082757 filed Jan. 5, 2007, 4 pgs.

* cited by examiner

*Primary Examiner*—Henry Hung Nguyen
(74) *Attorney, Agent, or Firm*—Sterne, Kessler, Goldstein & Fox PLLC (57) ABSTRACT

A system and method are used to feed a flexible substrate through a patterned beam to be exposed at target portions by the pattered beam. In one example, the flexible substrate is passed over a chuck (e.g., a vacuum chuck). In one example, the chuck can bias the flexible substrate against a chuck surface during alignment, focus, and exposure operations. By biasing the flexible substrate, the flexible substrate can continuously move while being held against the chuck. In one example, the flexible substrate is fed onto the vacuum chuck from a supply roller and fed off the chuck and wrapped on to a take-up roller. The supply and take-up rollers are rotated to follow the scanning motion, which minimizes or substantially eliminates tension on the flexible substrate during the exposure period.

14 Claims, 12 Drawing Sheets

SYSTEM AND METHOD FOR PATTERNING A FLEXIBLE SUBSTRATE IN A LITHOGRAPHY TOOL

CROSS REFERENCE TO RELATED APPLICATIONS

This application claims benefit under 35 U.S.C. § 119(e) to U.S. Provisional Patent Application 60/555,302, filed Mar. 23, 2004, which is incorporated by reference herein in its entirety.

BACKGROUND OF THE INVENTION

1. Field of the Invention

The present invention is related to a lithography system.

2. Background Art

Recently, the electronics industry has developed method of creating integrated electronic devices that can be manufactured on a continuous strip, web, film, etc. of flexible material, such as polyester or MYLAR® (e.g., a flexible substrate). The flexible material typically has a thickness of only about 25 microns to about 150 microns, which can lead to stretching of the material. Stretching can cause distortion problems. Also, the flexible substrate is typically stored by rolling the flexible substrate up on spools. This type of operation is not compatible with existing lithography tool designs because feeding a continuous strip of material onto a precision substrate stage can interfere with the accuracy of the substrate stage's motion, inhibiting the achievement of overlay and imaging tolerances. Further, the flexibility of the flexible substrate and its dimensional stability can become more of a problem when micron size features are being patterned with quarter micron overlay.

Finally, the flexible substrate thickness also lends itself to variation with temperature variations.

Therefore, what is needed is a lithography system and method that allow for better control during lithographic processing of a flexible substrate, e.g., to unroll and roll the flexible substrate onto the machine so as not to interfere with precision scanning motions of a carriage holding a pattern generator when the flexible substrate is proximate an exposure area of the carriage.

BRIEF SUMMARY OF THE INVENTION

An embodiment of the present invention provides a lithography system including an illumination system, a pattern generator, a projection system, and a moving system. The illumination system generates a beam of radiation. The pattern generator patterns the beam. The projection system projects the patterned beam onto a target portion of a flexible substrate to pattern the flexible substrate. The moving system controls movement of the flexible substrate, such that the target portion of the flexible substrate remains substantially unstretched during receipt of the patterned beam.

Another embodiment of the present invention provides a method of patterning a flexible substrate in a lithography system including the following steps. Moving the flexible substrate through the lithography system a first time to initialize the lithography system. Patterning a beam of radiation after the moving step is completed. Moving the flexible substrate through the lithography system a second time, so that the flexible substrate is patterned with the patterned beam. Controlling the second moving step, such that the flexible substrate remains substantially unstretched during the patterning with the patterned beam.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers may indicate identical or functionally similar elements. Additionally, the left-most digit(s) of a reference number may identify the drawing in which the reference number first appears.

DETAILED DESCRIPTION OF THE INVENTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

One or more embodiments of the present invention provide a lithography system that feeds a flexible substrate through a patterned beam to be exposed at target portions by the pattered beam.

In one example, the flexible substrate is passed over a chuck (e.g., a vacuum chuck). In one example, the chuck can bias the flexible substrate against a chuck surface during alignment, focus, and exposure operations. By biasing the flexible substrate, the flexible substrate can continuously move while being held against the chuck. In another example, the flexible substrate can be clamped to the vacuum chuck, or the like, during moments of non-movement.

In one example, the flexible substrate is fed onto the vacuum chuck from a supply roller and fed off the chuck and wrapped on to a take-up roller. The supply and take-up rollers are rotated to follow the scanning motion, which minimizes or substantially eliminates tension on the flexible substrate chuck during the exposure period.

In one example, the flexible substrate is fed onto and off of the vacuum chuck in a direction parallel to the exposure scan axis. In another embodiment, the flexible substrate is fed into and out of the vacuum chuck orthogonal to the scanning axis.

In one example, the supply and take-up rollers are mounted on a separate single axis stage that moves along the scanning motion of the exposing stage.

Terminology and Overview

Throughout this description, the use of "system" or "lithography system" is meant to include photolithography, direct write lithography, maskless lithography, immersion lithography, imprint lithography, and the like.

Throughout the description, the use of "pattern generator" includes a reflective or transmissive static (e.g., reticle, mask, or contrast device) or dynamic (e.g., liquid crystal display, spatial light modulator, grating light valve, digital mirror device, or any other device) patterning device that can be used to impart patterns onto a light beam, as will become apparent to one or ordinary skill in the art upon reading this description. The pattern generators are used in the lithography systems to pattern substrates (e.g., semiconductor wafers, flat panel display substrates, or the like).

Dynamic pattern generators can include an active area having an n×m (wherein n and m are integers greater than or equal to 1) array of active devices (or pixels) (e.g., an array of mirrors on the DMD, an array of gratings on a GLV, or an array of reflective/transmissive devices on the LCD). Each active device is individually controlled to change the active devices between ON and OFF states through one or more discrete states. For example, if the active devices are mirrors on the DMD, each of the mirrors is individually controlled to rotate, piston, or tilt the mirror to either binary or multiple positions. As another example, if the active devices are strips in a GLV, sets of strips can be bent or straightened to allow reflection or diffraction of incoming light beams.

It is to be appreciated that controlling the active devices in active areas so that they are partially or fully ON or OFF is well know in the art, and not fully described here for brevity. Typically, a predetermined and previously stored algorithm (e.g., pattern information or pattern data) based on a desired exposure pattern is used to turn ON (or partially ON) and OFF the active devices, as is known in the relevant arts.

Lithography is a process used to create features on the surface of a substrate. Such substrates can include those used in the manufacture of flat panel displays (e.g., liquid crystal displays), circuit boards, various integrated circuits, and the like. A frequently used substrate for such applications is a semiconductor wafer or flat panel display glass substrate. While this description is written in terms of a semiconductor wafer for illustrative purposes, one skilled in the art would recognize that this description also applies to other types of substrates known to those skilled in the art.

During lithography, a wafer, which is disposed on a wafer stage, is exposed to an image (e.g., a pattern) formed by the pattern generator, or array thereof. The image is projected onto the surface of the wafer by exposure optics located within a lithography apparatus. While exposure optics are used in the case of photolithography, a different type of exposure apparatus can be used depending on the particular application. For example, an excimer laser, x-ray, ion, electron, or photon lithography can each require a different exposure apparatus, as is known to those skilled in the art. The particular example of photolithography is discussed here for illustrative purposes only.

The projected image produces changes in the characteristics of a layer (e.g., photoresist) deposited on the surface of the wafer. These changes correspond to features in the image projected onto the wafer during exposure. Subsequent to exposure, the layer can be etched to produce a patterned layer. The pattern corresponds to the features projected onto the wafer during exposure. This patterned layer is then used to remove or further process exposed portions of underlying structural layers within the wafer, such as conductive, semiconductive, or insulative layers. This process is then repeated, together with other steps, until the desired features have been formed on the surface, or in various layers, of the wafer.

Step-and-scan technology works in conjunction with a projection optics system that has a narrow imaging slot. Rather than expose the entire wafer at one time with the image formed by the pattern generator, individual fields are scanned onto the wafer one at a time. This is accomplished by moving the wafer and controlling active devices on the pattern generator, such that the imaging slot is moved across the field during the scan. The wafer stage must then be stepped between field exposures to allow multiple copies of the pattern formed by the active devices on the pattern generator to be exposed over the wafer surface. In this manner, the quality of the image projected onto the wafer is maximized.

Overall System

Figure 1:
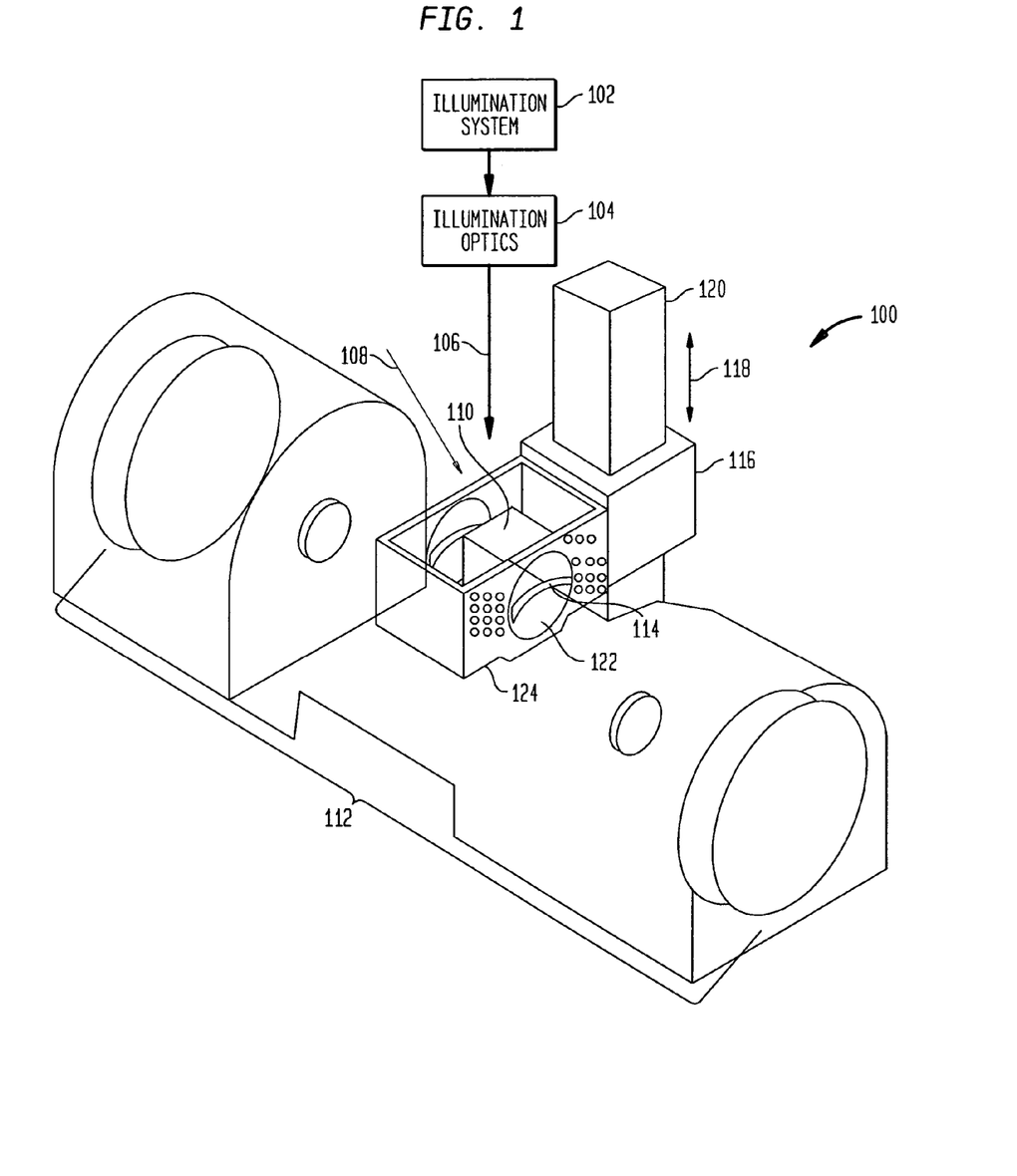
FIG. 1 shows a lithography system for patterning a flexible substrate, according to one embodiment of the present invention.

FIG. 1 shows a lithography system 100, according to one embodiment of the present invention. Lithography system 100 includes an illumination system 102, which may include illumination optics or optics 104 may be separately located. Illumination system 102 generates a beam of radiation 106, which is directed towards a pattern generator 108 via optics 110. Patterned light (not shown) is directed, using projection system 112, onto an exposure area 122. Exposure area 122 can either hold a substrate (not shown) or have a substrate proximate thereto, as is described in more detail below. In one example, the substrate can be a flexible substrate (e.g., a web, film, sheet, or strip made out of a material that allows a feature to be formed thereon, e.g., polyester or MYLAR®). The patterned light forms features on the substrate through an exposure slit area 114 in exposure area 122. In this embodiment, pattern generator 108 and exposure area 122 are both associated with a carriage or stage 116 that can move in the directions of arrows 118 along an extension 120 (e.g., a guide) of lithography system 100. In the example using a flexible substrate, carriage 116 includes a support 124 (e.g., a chuck, a vacuum chuck, or the like).

An exemplary system that can be used to perform the lithographic process can be MICRALIGN® lithography tool manufactured by ASML, Veldhoven, The Netherlands. The Micralign tool can be used to compensate for magnification, skew, scaling, X and Y positioning, and other global errors. The errors can be measured using an alignment system (not shown) and a stitching scheme devised to overlap certain problem areas. For example, an indexed field can be stitched to a subsequent indexed field based on index marks, discussed below, and all errors, other than local distortion errors, can be compensated for.

Some of the various embodiments and/or examples discussed above or below discuss various ways to compensate for distortion error.

Figures 2, 3:
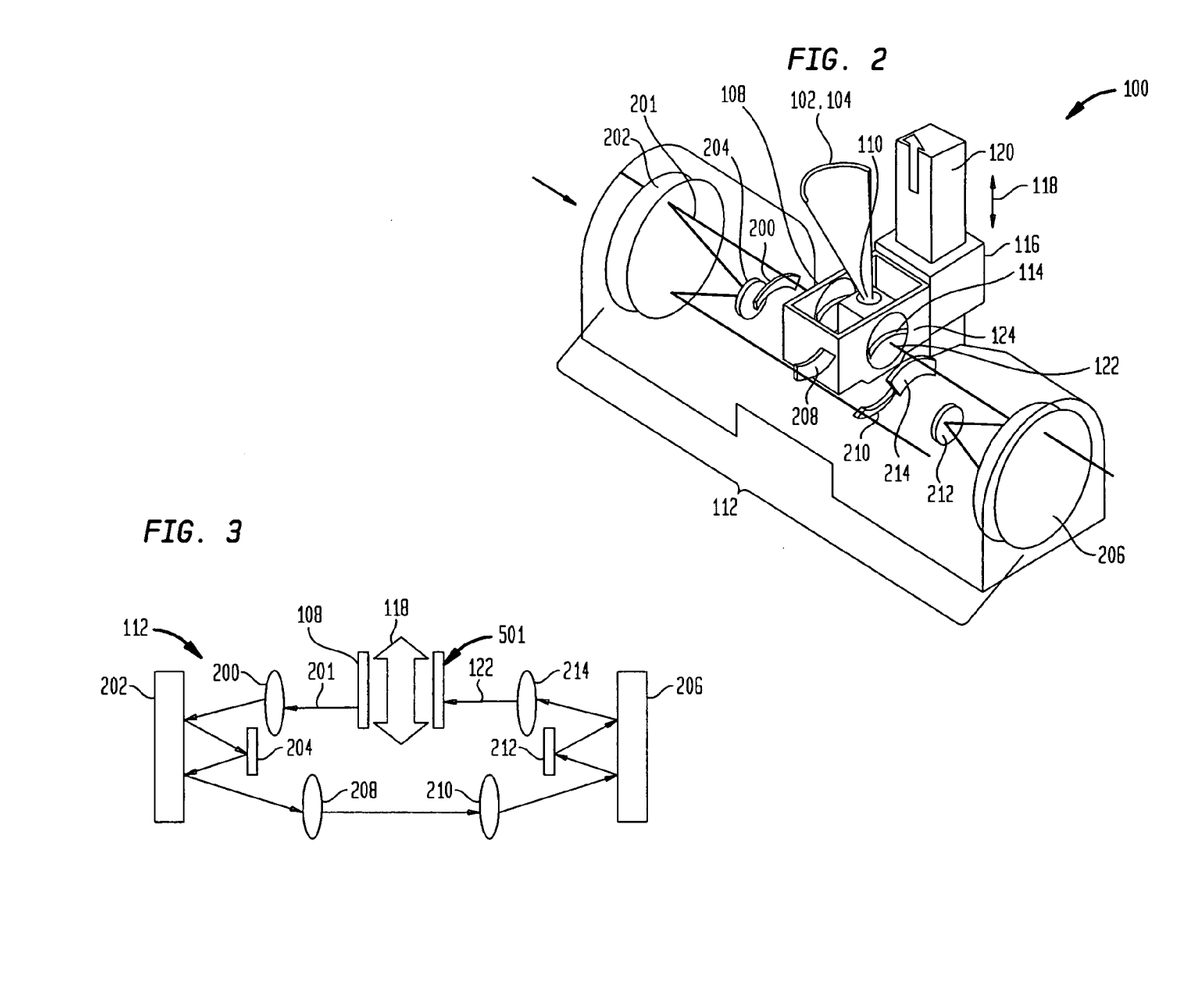
FIGS. 2 and 3 show an exemplary light path through the lithography system of FIG. 1 using a transmissive pattern generator, according to one embodiment of the present invention.

FIGS. 2 and 3 show optical elements 200, 201, 202, 204, 206, 208, 210, 212, and 214 in projection system 112, according to one embodiment of the present invention. In this embodiment, pattern generator 108 is transmissive. Patterned light from optical elements 102 passes through pattern generator 108 to form a patterned light beam 201. Patterned light beam 201 is directed using lens 200 to reflect off optical element 202, optical element 204, and again of optical element 202. After reflecting off optical element 202 for the second time, patterned light 201 is directed to reflect off optical element 206 using lenses 208 and 210. Patterned light reflects from optical element 206 to optical element 212 and back to optical element 206 before being directed onto exposure area 122 using lens 214.

Exemplary Exposure of a Flexible Substrate Moving Parallel to a Scan Direction

Figure 4:
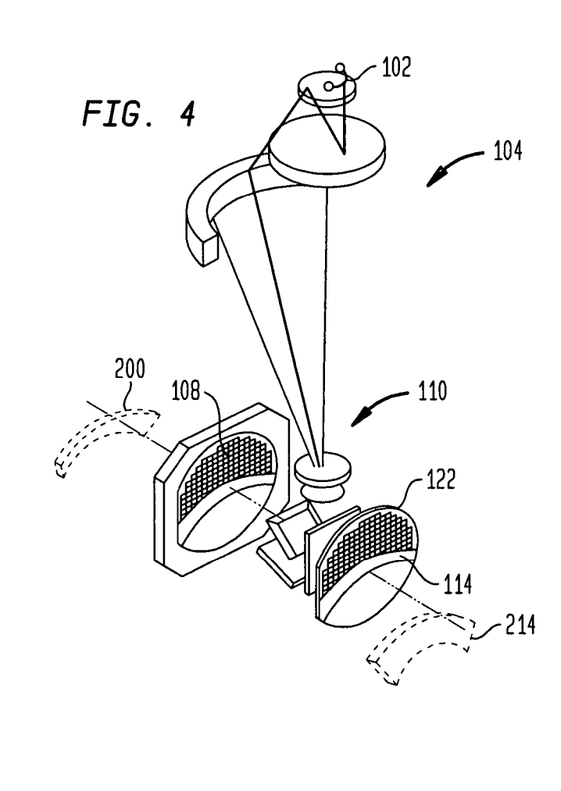
FIG. 4 shows a portion of a lithography system of FIG. 1 in a state when a flexible substrate is not in the lithography system, according to one embodiment of the present invention.

FIG. 4 shows a portion of lithography system 100 in a state when a flexible substrate 501 is not in lithography system 100, according to various embodiments of the present invention.

Figure 5:
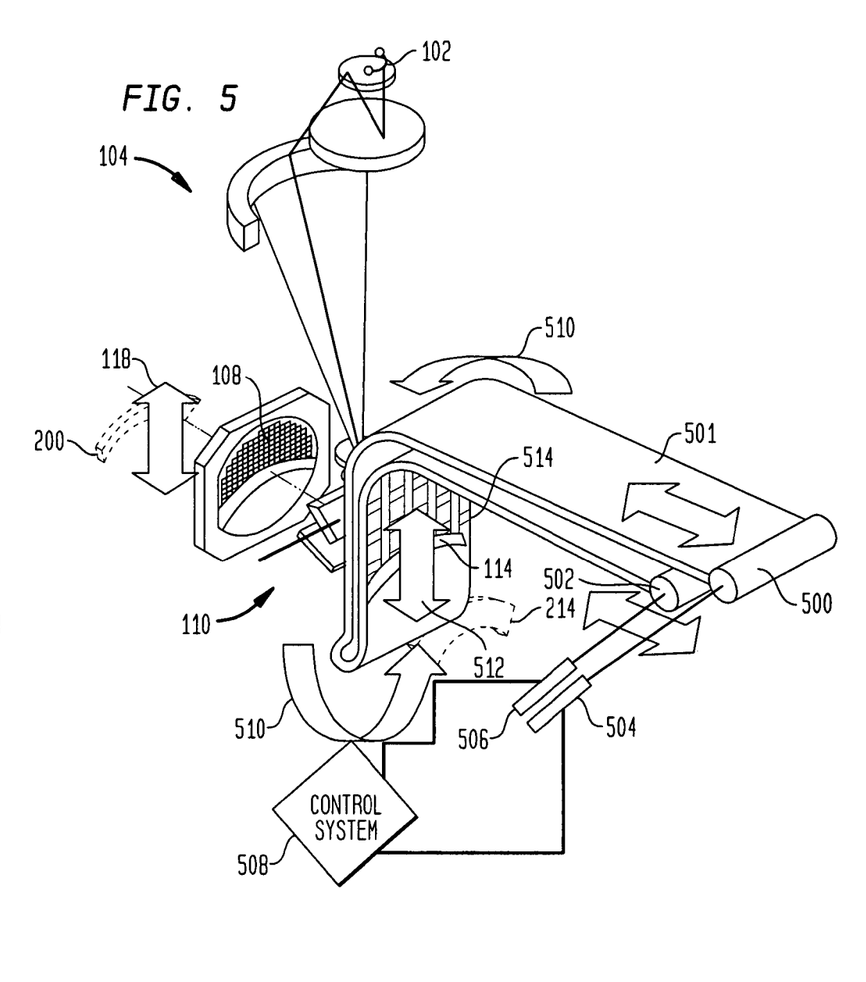
FIGS. 5, 6, and 7 show the lithography system in FIGS. 4 in a state when a flexible substrate is moving parallel to an exposure scan axis, according to various embodiments of the present invention.
Figure 6:
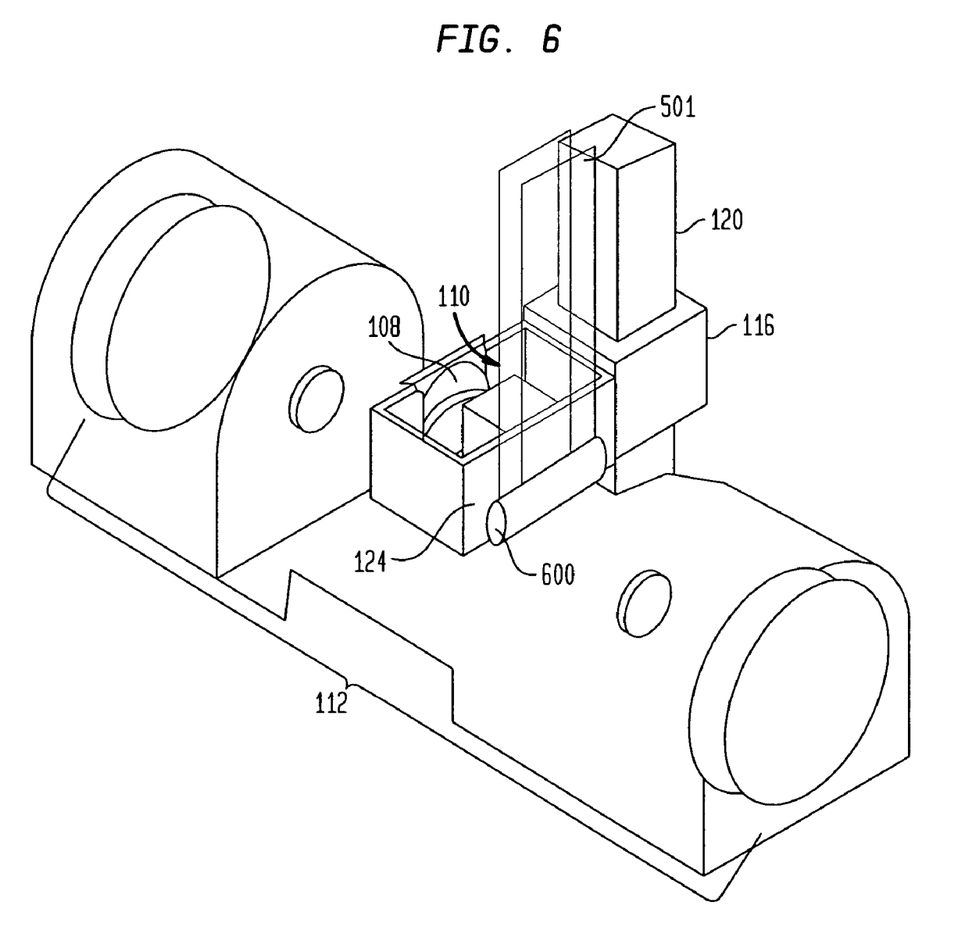
Figure 7:
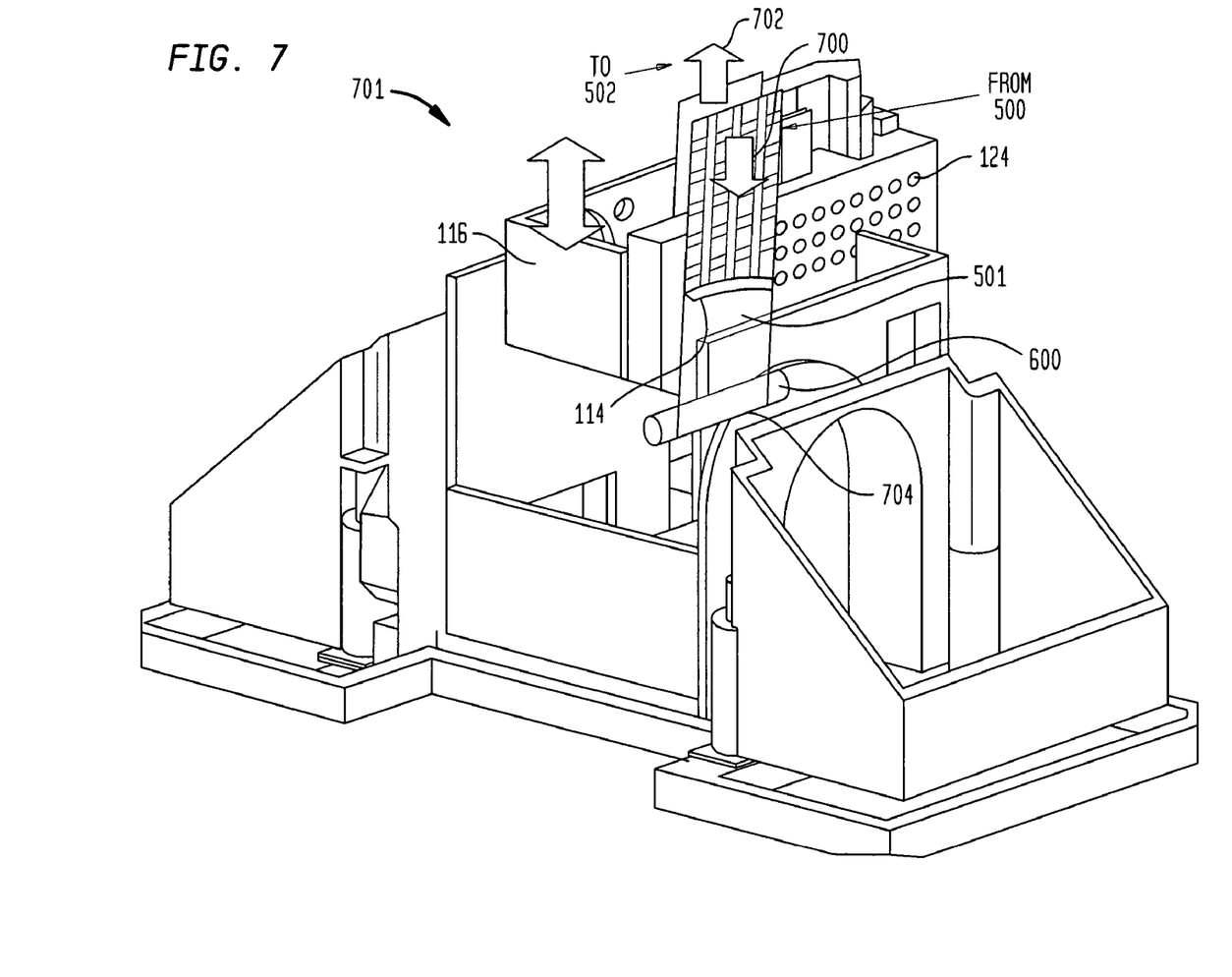

FIGS. 5, 6, and 7 show lithography system 100 in a state when a flexible substrate 501 is moving parallel to an exposure scan axis, according to various embodiments of the present invention.

In one example, when a flexible substrate 501 is used, flexible substrate 501 moves across or is biased against support 124 (not shown, see FIG. 1). In this way, flexible substrate 501 is caused to be substantially flat and somewhat "rigid" during a moment of exposure, so as to substantially reduce or eliminate stretching, which also substantially reduces or eliminates distortion of patterned features. In this example, flexible substrate 501 is "biased," which means flexible substrate 501 is held against chuck 124, but still allowed to move. In another example, flexible substrate 501 can be clamped against chuck 124, such as when chuck 124 is a vacuum chuck. Other ways of ensuring that flexible substrate 501 is at least momentarily flattened and/or unstretched are also contemplated within the scope of the present invention.

In the embodiment shown in FIG. 5, flexible substrate 501 can be coupled on one end to a first holding device 500 (e.g., a feed roller, drum, or spool, hereinafter all are referred to as "feed roller") and on another end to a second holding device 502 (e.g., a take-up roller, drum, or spool, hereinafter all are referred to as "take-up roller"). In one example, one or both of the rollers 500 and 502 can have motors 504 and 506, respectively, coupled thereto, such that rollers 500 and 502 turn under the influence of their respective motor 504 and 506.

In the example shown, flexible substrate 501 moves in a direction of arrows 510 and patterning of substrate 501 is done through illumination field 114 in a direction of arrow 512 (e.g., a scanning direction). The patterning is shown as checkered section 514 above illumination field 114. Thus, in this embodiment, flexible substrate 501 moves in a direction parallel to a scanning direction 512 (e.g., a patterning direction).

In one example, motors 504 and 506 can be coupled to a control system 508 that controls at least one of acceleration, speed, and the like, of rollers 500 and 502, so that at least one of tension, slack, and force on flexible substrate 501 are maintained within strict tolerances. This can be done to substantially reduce or eliminate distortion of flexible substrate 116 when it is exposed with patterned beam 112. The control system 508, motors 504 and 506, and/or rollers 500 and 502 can be considered all or part of a moving system.

In one example, during an exposure operation a plurality of portions of flexible substrate 501 can be individually indexed with an index mark. In another embodiment, during an exposure operation groups or sets of portions of flexible substrate 501 can be in indexed with an index mark. In one or both of these examples, after all layers are patterned, flexible substrate 501 can be separated into the portions. This can be done because some devices (e.g., electronic devices) can be larger than any one of the portions. The index marks are used to overlay two or more portions to form a single one of the devices.

In one example, projection system 112 provides a 1:1 magnification between an active area size on pattern generator 108 and a feature on flexible substrate 501. It is to be appreciated that other magnifications can also be used, as would become apparent to one of ordinary skill in the art upon reading the description.

As discussed above with respect to FIGS. 1 and 2, pattern generator 108 and chuck 124 can be coupled to carriage 116. As flexible substrate 501 moves across chuck 124, flexible substrate 501 can displace carriage 116 and/or exposure area 122. If the displacement is more than a desired distance (e.g., about a couple of nanometers in one application of system 100), this displacement can cause errors large enough to make overlay beyond a given tolerance. In this environment, which will be discussed in more detail below, slack and tension of flexible substrate 501 need to be precisely controlled in order to substantially reduce or eliminate the displacement of carriage 116. In one example, this can be done through use of controller 508 and motors 504 and 506.

FIG. 6 shows lithography system 100 including a roller 600, according to one embodiment of the present invention. For example, roller 600 can be an inertia roller, which is discussed in more detail below with respect to FIGS. 14 and 15. Roller 600 can have a constant force pressure on it and have an inertia similar to an infinitely thin shell. This can be done using fly wheels (not shown, see element 1400 in FIGS. 14 and 15) on an edge of roller 600 that have a desired inertia. Doing this creates an environment in which one side of roller 600 has constant force, while the other side of roller 600 has no force. Roller 600 can function as a perfect isolator, which can control the tension on roller 600 without affecting the tension on flexible substrate 501.

FIG. 7 shows a portion 701 of lithography system 100, according to one embodiment of the present invention. Flexible substrate 501 is fed onto and off of vacuum chuck 124 in a direction parallel to an exposure scan axis, which is parallel to the scan direction 512 (FIG. 5). In one example, this can also be described as feeding from the top of lithography system 100.

In one example, supply and take-up rollers 500 and 502, not shown in this figure, are rotated to follow a scanning motion of carriage 116, which can be done to minimize tension during an exposure period.

Arrow 700 shows an incoming direction and arrow 702 shows an outgoing direction of flexible substrate 501. Low inertia roller 600 can be used at a bending point 704 of a path of flexible substrate 501, which allows flexible substrate 501 to bend without affecting tension on flexible substrate 501 at exposure slit 114.

Exemplary Exposure of a Flexible Substrate Moving Orthogonal to a Scan Direction FIGS. 8, 9, 10, 11, and 12 show lithography system 100 patterning a flexible substrate 501 moving orthogonal to an exposure scan axis, according to various embodiments of the present invention.

Figure 8:
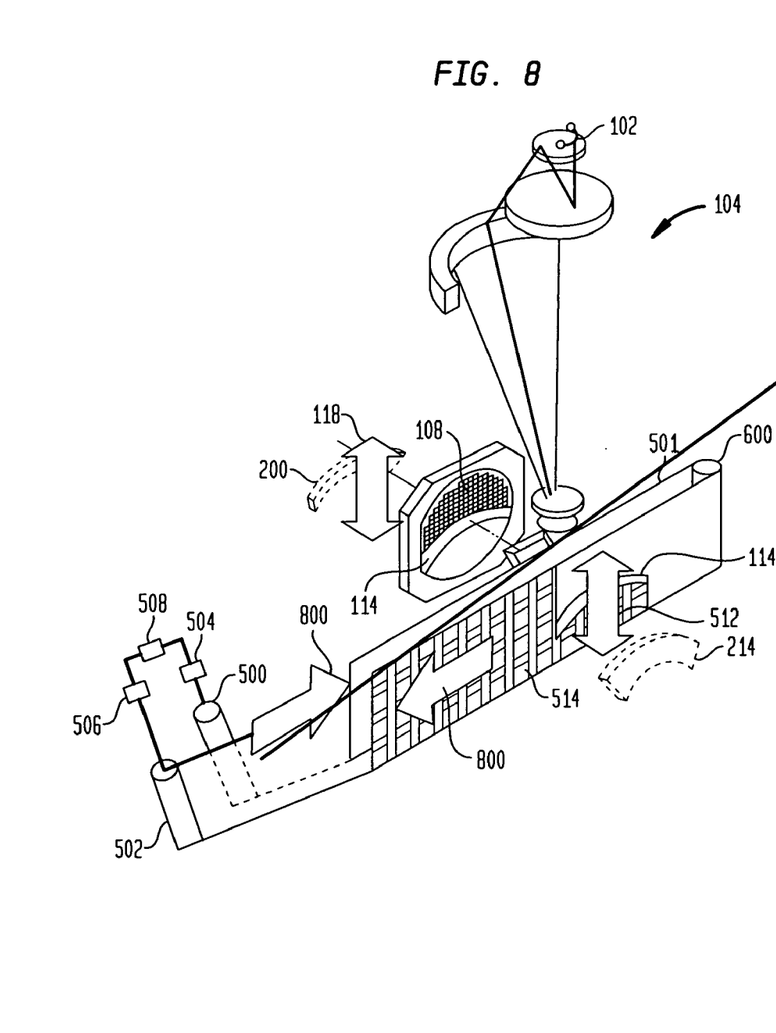
FIGS. 8, 9, 10, 11, and 12 show lithography systems patterning a flexible substrate moving orthogonal to an exposure scan axis, according to various embodiments of the present invention.
Figure 9:
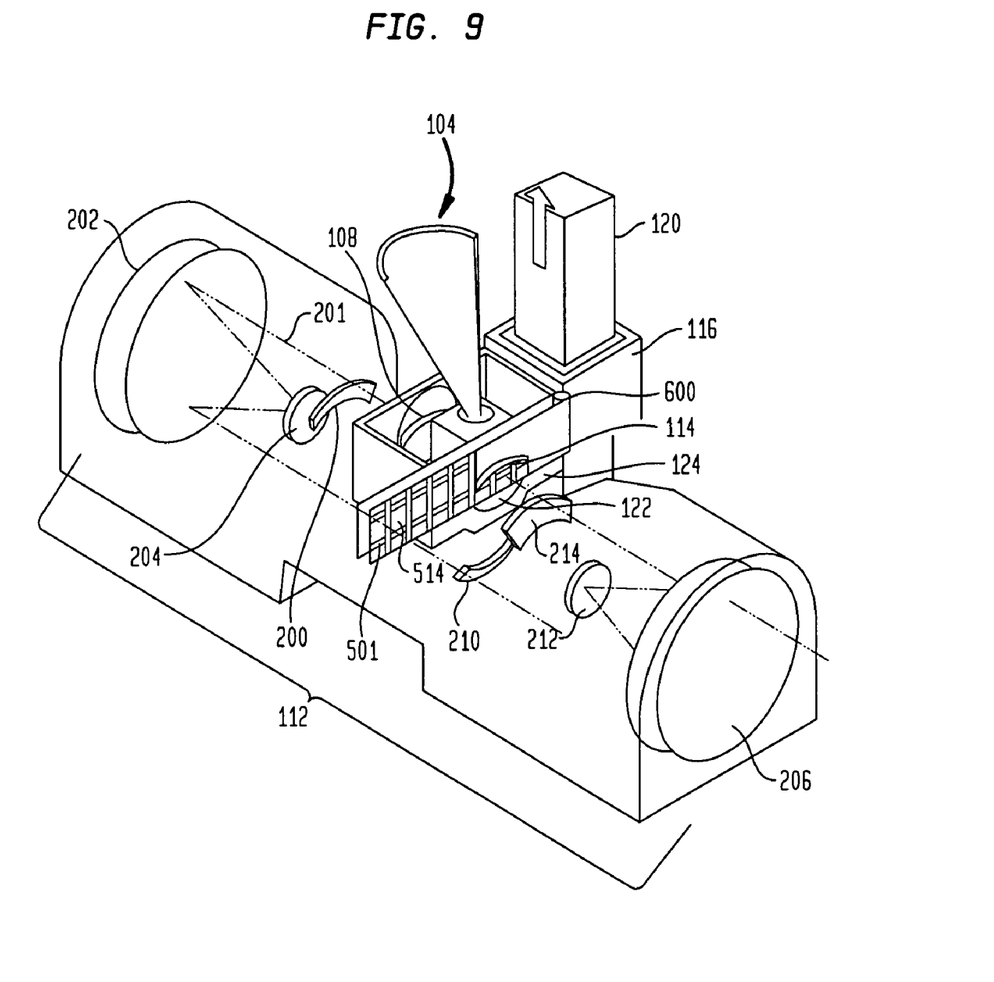
Figure 10:
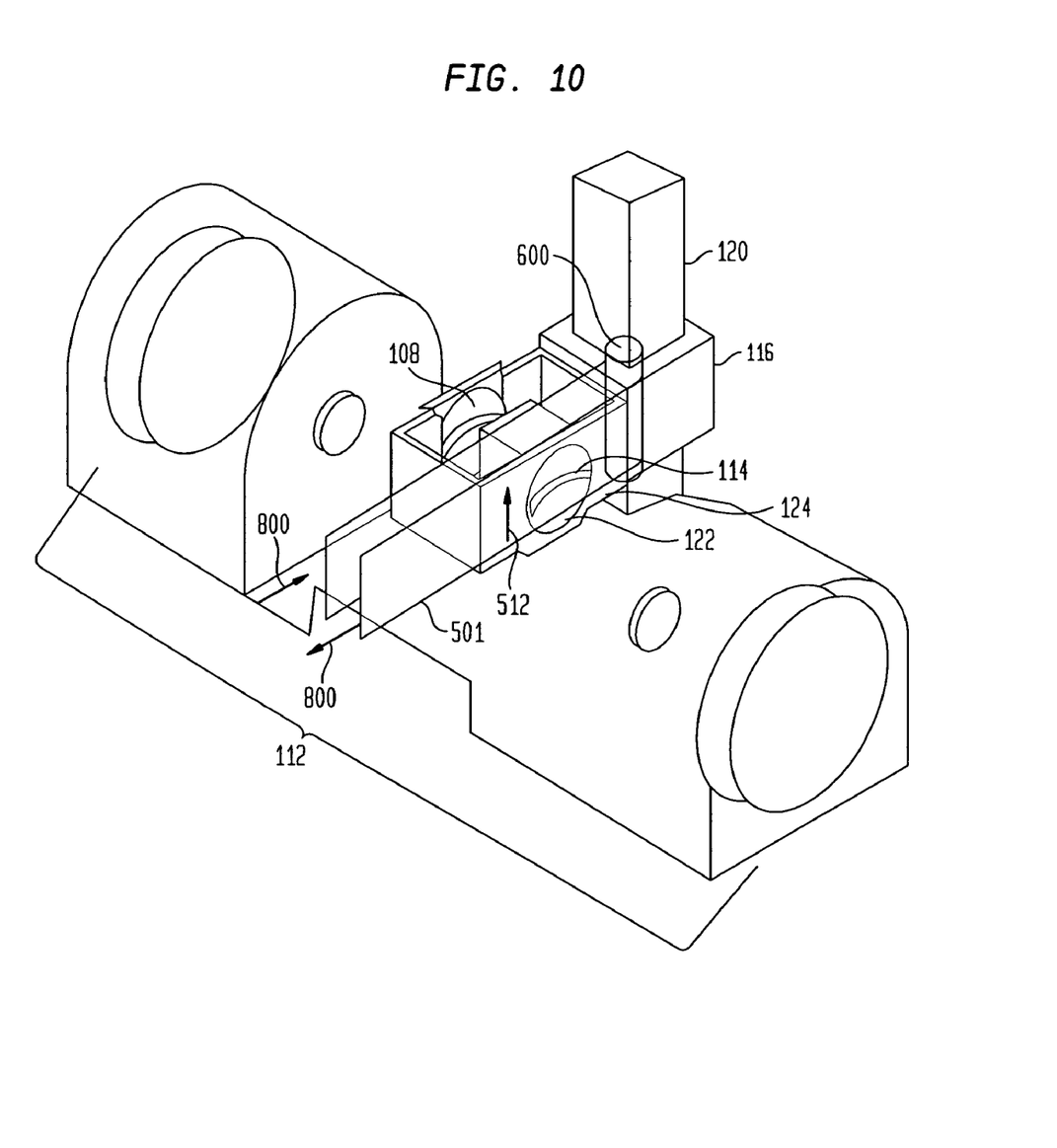

In the embodiments shown in FIGS. 8, 9, and 10, as described above, flexible substrate 501 can be coupled on one end to a first roller 500 and at another end to a second roller 502. Rollers 500 and 502 can have motors 504 and 506, respectively, coupled thereto, such that rollers 500 and 502 turn under the influence of their respective motor 504 and 506. In this embodiment, flexible substrate 501 moves in the direction of arrows 800, and patterning of substrate 501 is done through illumination field 114 in the direction of arrow 512 (e.g., a scanning direction). The patterning is shown as checkered section 514 above illumination field 114. Thus, in this embodiment, flexible substrate 501 moves in a direction orthogonal to a scanning direction 512 (e.g., a patterning direction).

Figure 11:
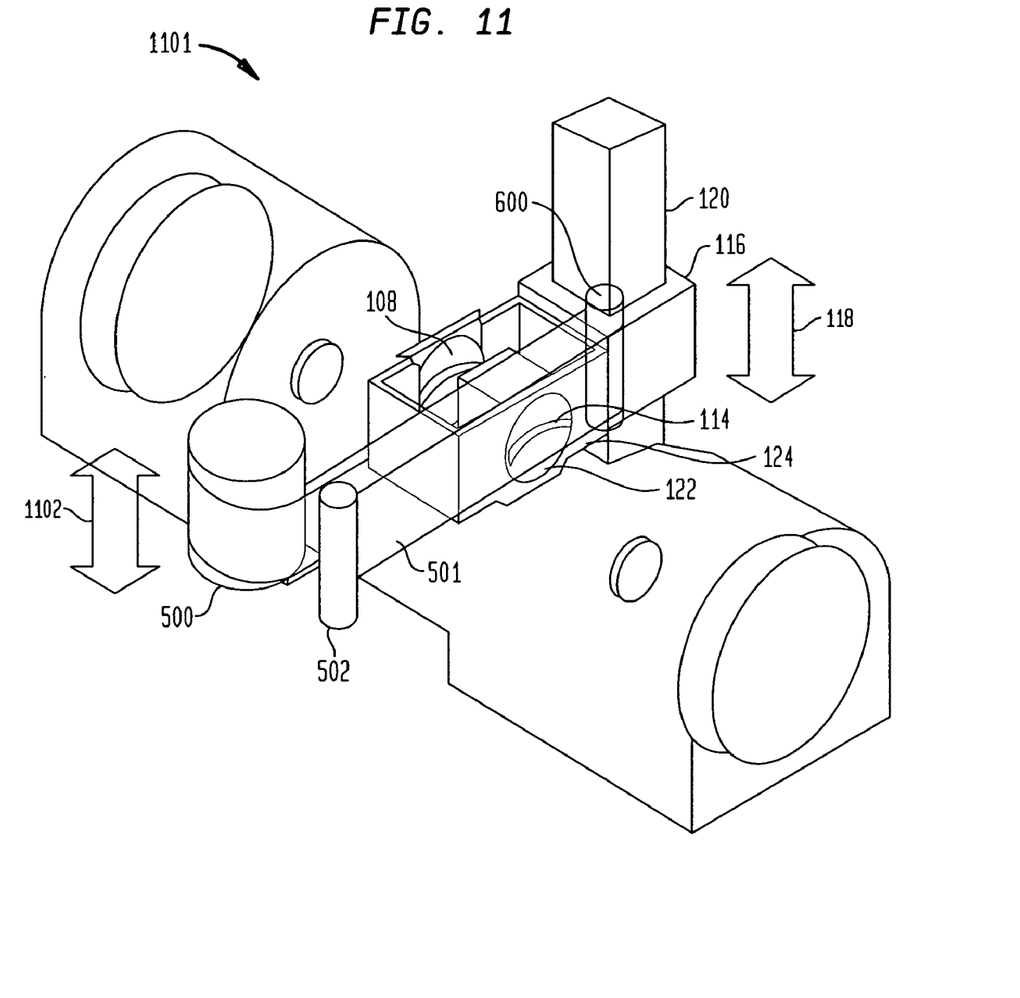
Figure 12:
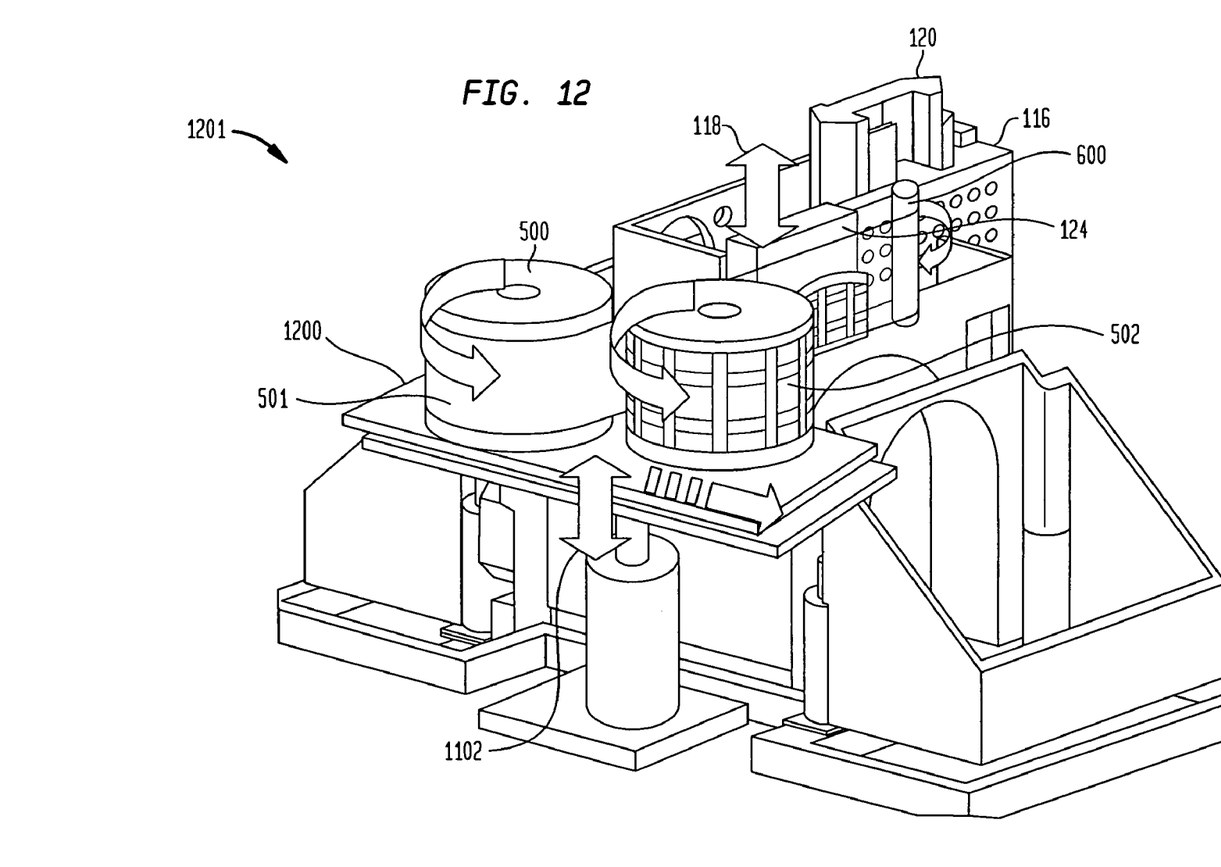

FIGS. 11 and 12 show portions 1101 and 1201, respectively, of lithography tool 100, according to various embodiments of the present invention. Flexible substrate 501 is fed onto and off of vacuum chuck 124 orthogonal to the scanning axis, which is orthogonal to scan direction 512. In one example, this can also be described as feeding from the front of lithography system 100. In one example, the supply and take-up rollers 500 and 502, respectively, are mounted on a separate single axis stage 1200 (see FIG. 12). Stage 1200 moves in direction of arrow 1102, which is a same direction as arrow 118. Thus, stage 1200 moves along with carriage 116 to avoid displacing flexible substrate 501 during scanning of carriage 116. Rollers 500 and 502 feed flexible substrate 501 with precisely controlled tension in the direction of a scan axis. This embodiment can also include a low inertia roller 600 that isolates tension disturbances, as was described above.

In one example, flexible substrate 501 can be fed onto and off of an exposing stage (not shown) that moves in the X and Y directions.

In another example, at least one of extra guide rollers and cylindrical air bearing lubricated bars (not shown) can be used, which would allow flexible substrate 501 to be guided on a resist side of flexible substrate 501 without damage.

In a further example, vacuum clamps can be used to allow tension on flexible substrate 501 to be removed from the portion of flexible substrate 501 that goes to and from scanning stage 1200 (e.g., carriage or stage) without removing tension from the rollers 500 and 502.

In a still further example, precise tensioning of flexible substrate 501 can be achieved by passing flexible substrate 501 over a movable constant force tensioning roller (e.g., roller 600) that has an effective mass equal to its rotational inertia times its radius squared. Such a roller effectively isolates tension variations on one side of the roller to the other.

Exemplary Operation

Figure 13:
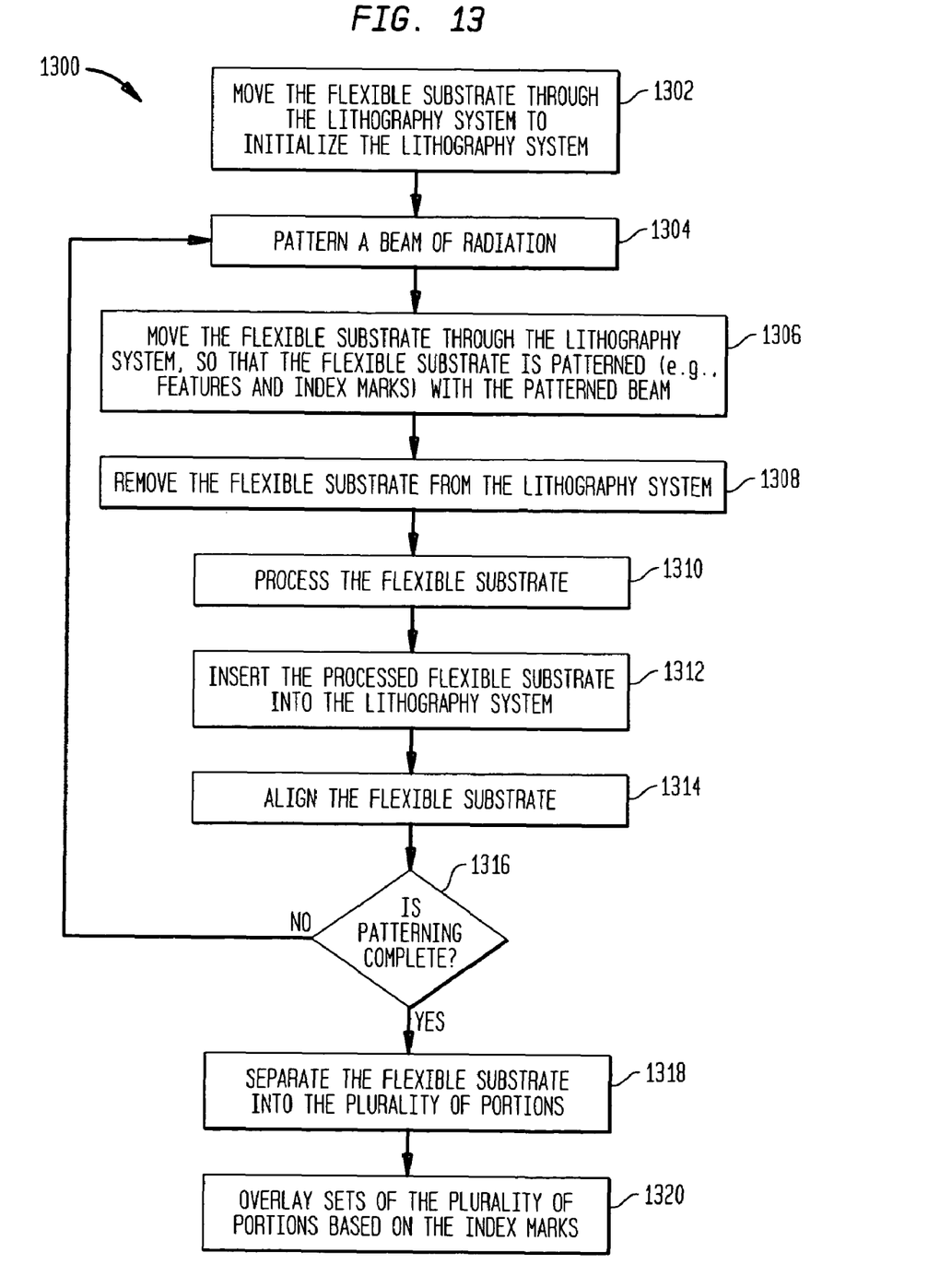
FIG. 13 shows a flowchart depicting a method of patterning a flexible substrate, according to one embodiment of the present invention.

FIG. 13 shows a flowchart depicting a method 1300 according to an embodiment of the present invention. For example, method 1300 can be performed with one or more of the systems shown in FIGS. 1-12. In step 1302, the flexible substrate is moved through a lithography system to initialize the lithography system. In step 1304, a beam of radiation is patterned. In step 1306, the flexible substrate is moved through the lithography system a second time, so that the flexible substrate is patterned with the patterned beam.

In one example, the following steps can also occur. In step 1308, the flexible substrate is removed from the lithography system. In step 1310, the flexible substrate is processed according to known or future semiconductor and/or thin film processing techniques, such as etching, etc. In step 1312, the processed flexible substrate is inserted back into the lithography system. In step 1314, the flexible substrate is aligned. In step 1316, a determination is made whether all patterning is complete. If no, steps 1304-1314 are repeated until all features are patterned on the flexible substrate. If yes the method 1300 can end, or additional steps discussed below can occur.

In one example, the following steps can also occur. Optionally, during step 1306, a feature and an index mark are patterned on a plurality of portions of the flexible substrate. In step 1318, the flexible substrate is separated into the plurality of portions. In step 1320, sets of the plurality of portions are overlaid based on the index marks.

Exemplary Embodiment of Low Inertia Roller

Figure 14:
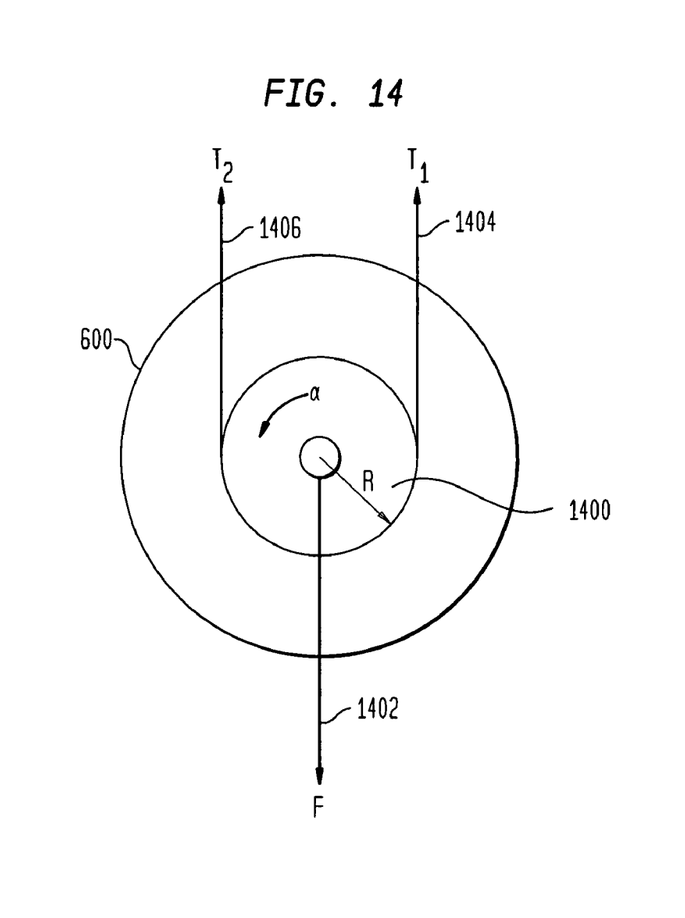
FIGS. 14 and 15 show an end and side view, respectively, of a roller, according to one embodiment of the present invention.
Figure 15:
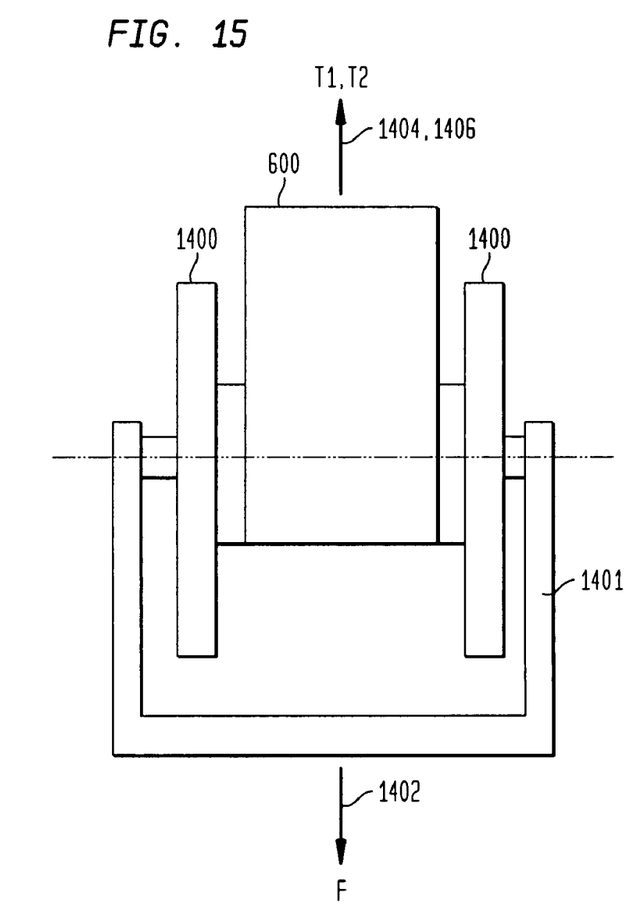

FIGS. 14 and 15 show end and side views, respectively, of roller 600 including flywheels 1400 on each side, according to one embodiment of the present invention. In this embodiment, roller 600 with inertia flywheels 1400 is supported by a support device 1401.

In one example, roller 600 and flywheels 1400 are sized so that I=MR2, where M is a mass of entire roller assembly, I is an angular inertia of roller 600 including flywheels 1400, and R is a radius of each flywheel 1400. When this condition is met, variations in tension on one side of roller 600 are not transmitted to the other side. This type of roller 600 can be used to isolate tension variations associated with supply or feed spools (e.g., elements 500 and 502 in FIG. 5 discuss above) from the processing components of a spool to spool flexible substrate processing system.

An exemplary derivation of formula for isolation of tensioning forces is as follows, with F being an external tensioning force, shown in FIGS. 14 and 15 as being in the direction of arrow 1402, and with $T_1$ and $T_2$ being tensioning forces of a flexible substrate, shown in FIGS. 14 and 15 as being in the direction of arrows 1404 and 1406:

$$T_1+T_2-F=Ma \qquad 1.$$

where a=the linear acceleration of the roller assembly $$(T_1-T_2)R=I\alpha \qquad 2.$$

where α=the angular acceleration of the roller & flywheels $$T_1+T_2=Ma+F \qquad 3.$$

$$T_1-T_2=I\alpha/R \qquad 4.$$

$$2T_1=Ma+F+I\alpha/R \qquad 5.$$

then adding equations 3 and 4

$$\alpha=a/R \qquad 6.$$

which is also a relationship between angular and linear acceleration $$2T_1=Ma+F+Ia/R^2 \qquad 7.$$

then substituting equation 6 into equation 5

$$a=(T_1+T_2-F)/M \qquad 8.$$

then solving equation 1 for α

$$2T=M[(T_1+T_2-F)/M]+F+I[(T_1+T_2-F)M]/R^2 \qquad 9.$$

then substituting equation 8 into equation 7

$$T_2=[(MR^2-I)T1+I\ F]/(MR^2+I) \qquad 10.\ 11.$$

finally, solving equation 9 for $T_2$ and assuming $MR^2=I$ $$T_2=IF/2I=F/2 \qquad 12.$$

Thus, a tensioning roller that meets the condition I=MR2 should not transmit tension force variations.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections may set forth one or more, but not all exemplary embodiments of the present invention as contemplated by the inventor(s), and thus, are not intended to limit the present invention and the appended claims in any way.

What is claimed is:

1. A system, comprising:
    a radiation system that generates a beam of radiation;
    a pattern generator that patterns the beam;
    a projection system that projects the patterned beam onto target portions of a flexible substrate to pattern the flexible substrate;
    a chuck including first and second sides, the second side supporting the flexible substrate as the flexible substrate receives the patterned beam;
    a moving device including a feed roller and a take-up roller, the moving device moving the flexible substrate along a path through coupling the flexible substrate at a first end to the feed roller and at a second end to the take-up roller; and
    a bend roller that supports the flexible substrate at a bending point along the path,
    wherein the flexible substrate travels from the feed roller to the bend roller in a first direction adjacent the first side of the chuck and the flexible substrate travels from the bend roller to the take-up roller in a second direction, which is opposite of the first direction, against the second side of the chuck.

2. The system of claim 1, wherein the flexible substrate is elongated.

3. The system of claim 1, wherein:
    the flexible substrate comprises an elongated strip, a web, a film, or a sheet of material that forms features therein when exposed by the patterned beam.

4. The system of claim 1, wherein the moving system further comprises:
    a controller that controls a characteristics of at least one of the feed roller and the take-up roller.

5. The system of claim 4, wherein the characteristic comprises at least one of tension on, slack in, and force exerted on the flexible substrate.

6. The system of claim 1, wherein the flexible substrate moves across the chuck parallel to an exposure scanning direction of the patterned beam.

7. The system of claim 1, wherein the flexible substrate moves across the chuck orthogonal to an exposure scanning direction of the patterned beam.

8. The system of claim 1, wherein the chuck is a vacuum chuck that attracts the flexible substrate thereto, while allowing the flexible substrate to move during exposure.

9. The system of claim 1, wherein the moving system comprises:
    a first stage used to support the flexible substrate during exposure by the patterned beam;
    a second stage used to support the feed and take-up roller; and
    a control device that moves the second stage so that it follows movements of the first stage.

10. The system of claim 1, further comprising:
    an indexing system that forms indexing marks on portions of the flexible substrate that are exposed at different times, such that corresponding portions are overlaid to form a single electronic device using the indexing marks.

11. A method, comprising:
    (a) moving a flexible substrate through a lithography system a first time to initialize the lithography system;
    (b) patterning a beam of radiation after step (a) is completed;
    (c) moving the flexible substrate through the lithography system a second time adjacent a first side of a chuck in a first direction;
    (d) bending the flexible substrate to change its movement from the first direction to a second, opposite direction;
    (e) moving the flexible substrate through the lithography system against a second side of the chuck in the second direction, so that the flexible substrate is exposed to the patterned beam; and
    (f) controlling the moving in steps (c)-(e), such that the flexible substrate remains substantially unstretched during the patterning by the patterned beam.

12. The method of claim 11, further comprising:
    (di) removing the flexible substrate from the lithography system after step (c);
    (dii) processing the flexible substrate;
    (diii) inserting the processed flexible substrate into the lithography system;
    (div) aligning the flexible substrate; and
    (dv) repeating steps (b)-(div) until all features are patterned on the flexible substrate.

13. The method of claim 11, further comprising:
    patterning a feature and an index mark on a plurality of portions of the flexible substrate,
    separating the flexible substrate into the plurality of portions; and
    overlaying sets of the plurality of portions using the index marks.

14. A system, comprising:
    a radiation system;
    a patterning device;
    a projection system;
    a chuck;
    a feed roller coupled to a first end of a flexible substrate;
    a take-up roller coupled to a second end of the flexible substrate; and
    a bend roller that supports the flexible substrate at a bending point along a path of movement,
    wherein the feed roller and the take-up roller are adjacent each other on a same side of the chuck.

* * * * *